United States Patent
Spivack et al.

(10) Patent No.: US 7,145,071 B2
(45) Date of Patent: Dec. 5, 2006

(54) DYE SENSITIZED SOLAR CELL HAVING FINGER ELECTRODES

(75) Inventors: James L. Spivack, Cobleskill, NY (US); Harish R. Acharya, Clifton Park, NY (US); Donald F. Foust, Glenville, NY (US)

(73) Assignee: General Electric Company, Niskayuna, NY (US)

( * ) Notice: Subject to any disclaimer, the term of this patent is extended or adjusted under 35 U.S.C. 154(b) by 580 days.

(21) Appl. No.: 10/316,498

(22) Filed: Dec. 11, 2002

(65) Prior Publication Data

US 2004/0112421 A1    Jun. 17, 2004

(51) Int. Cl.
*H01L 31/00*    (2006.01)
(52) U.S. Cl. .................. 136/263; 136/256; 136/252; 429/111
(58) Field of Classification Search ........ 136/243–265; 429/111
See application file for complete search history.

(56) References Cited

U.S. PATENT DOCUMENTS

| | | | | |
|---|---|---|---|---|
| 5,482,570 A | * | 1/1996 | Saurer et al. ............... | 136/255 |
| 6,376,765 B1 | * | 4/2002 | Wariishi et al. ............ | 136/263 |
| 6,538,194 B1 | * | 3/2003 | Koyanagi et al. .......... | 136/256 |
| 6,580,026 B1 | * | 6/2003 | Koyanagi et al. .......... | 136/263 |
| 6,683,244 B1 | * | 1/2004 | Fujimori et al. ............ | 136/263 |
| 6,852,920 B1 | * | 2/2005 | Sager et al. ................ | 136/263 |

FOREIGN PATENT DOCUMENTS

| EP | 1 237 166 A2 | * | 9/2002 |
|---|---|---|---|
| WO | WO 99/63614 | * | 5/1999 |

OTHER PUBLICATIONS

U.S. Appl. No. 60/390,904, filed Jun. 22, 2002.*

* cited by examiner

*Primary Examiner*—Nam Nguyen
*Assistant Examiner*—Jeffrey Barton
(74) *Attorney, Agent, or Firm*—Fletcher Yoder

(57) ABSTRACT

A solar cell comprising at least one electrode having a plurality of fingers. Specifically, an electrode comprising a planar surface and a plurality of fingers extending therefrom is provided. A second electrode is provided. The second electrode comprises a planar surface and may comprise a plurality of fingers which are interdigitated with the fingers of the first electrode. The second electrode provides a catalyst material for the electron transfer to an oxidant during the photovoltaic process. A semiconductor material is disposed between the electrodes. The semiconductor material is saturated with dye and injected with an electrolyte solution. The fingers are arranged to provide a reduced migration path for the oxidant through the electrolyte and for the electrons through the semiconductor material when exposed to incident light.

28 Claims, 9 Drawing Sheets

DYE SENSITIZED SOLAR CELL HAVING FINGER ELECTRODES

CROSS-REFERENCE TO RELATED APPLICATIONS

The following commonly owned applications and patents are hereby incorporated by reference for all purposes:

U.S. patent application Ser. No. 10/316,317, filed concurrently herewith, entitled "Structured Dye Sensitized Solar Cell" by James L. Spivack and Harish R. Acharya, now U.S. Pat. No. 7,019,209;

U.S. patent application Ser. No. 10/316,318, filed concurrently herewith, entitled "Dye Sensitized Solar Cells Having Foil Electrodes" by James L. Spivack, John Yupeng Gui, and Reed Roeder Corderman; and U.S. patent application Ser. No. 10/316,519, filed concurrently herewith, entitled "Structured Micro-Channel Semiconductor Electrode For Photovoltaic Cells" James L. Spivack and Donald F. Foust, now U.S. Pat. No. 7,078,613.

BACKGROUND OF THE INVENTION

Generally speaking, photovoltaic systems are implemented to convert light energy into electricity for a variety of applications. Power production by photovoltaic systems may offer a number of advantages over conventional systems. These advantages may include, but are not limited to, low operating costs, high reliability, modularity, low construction costs, and environmental benefits. As can be appreciated, photovoltaic systems are commonly known as "solar cells," so named for their ability to produce electricity from sunlight.

Conventional solar cells convert light into electricity by exploiting the photovoltaic effect that exists at semiconductor junctions. Accordingly, conventional semiconductor layers generally absorb incoming light to produce excited electrons. In addition to the semiconductor layers, solar cells generally include a cover or other encapsulant, seals on the edges of the solar cell, a front contact electrode to allow the electrons to enter a circuit, and a back contact electrode to allow the ions created by the excitation of the electrons to complete the circuit.

One particular type of solar cell is a dye-sensitized solar cell. A dye-sensitized solar cell generally uses an organic dye to absorb incoming light to produce excited electrons. The dye sensitized solar cell generally includes two planar conducting electrodes arranged in a sandwich configuration. A dye-coated semiconductor film separates the two electrodes which may comprise glass coated with a transparent conducting oxide (TCO) film, for example. The semiconductor layer is porous and has a high surface area thereby allowing sufficient dye for efficient light absorption to be attached as a molecular monolayer on its surface. The remaining intervening space between the electrodes and the pores in the semiconductor film (which acts as a sponge) is filled with an organic electrolyte solution containing an oxidation/reduction couple such as triiodide/iodide, for example.

One exemplary technique for fabricating a dye-sensitized solar cell is to coat a conductive glass plate with a semiconductor film such as titanium oxide ($TiO_2$) or zinc oxide (ZnO), for example. The semiconductor film is saturated with a dye and a single layer of dye molecules self-assembles on each of the particles in the semiconductor film, thereby "sensitizing" the film. A liquid electrolyte solution containing triiodide/iodide is introduced into the semiconductor film. The electrolyte fills the pores and openings left in the dye-sensitized semiconductor film. To complete the solar cell, a second planar electrode with low overpotential for triiodide reduction is implemented to provide a cell structure having a dye-sensitized semiconductor and electrolyte composite sandwiched between two counter-electrodes.

Conventional dye sensitized solar cells may be fabricated using planar layered structures, as set forth above. The absorption of light by the dye excites electrons in the dye which are injected into the semiconductor film, leaving behind an oxidized dye cation. The excited electrons travel through the semiconductor film by a "random walk" through the adjacent crystals of the film towards an electrode. During the random walk of the electron to the electrode, the electron may travel a significant distance, and the electron may be lost by combining with a component of the electrolyte solution, also known as "recombination." Under irradiation by sunlight, the density of electrons in the semiconductor may be high such that such electron losses significantly reduce the maximum voltage and therefore the efficiency achievable by the solar cells. It may be advantageous to reduce the likelihood of recombination by reducing the travel path of the electron through the semiconductor and thereby reducing the length of time it takes for the electron to diffuse through the semiconductor to the conductive oxide of the electrode. One technique for reducing the travel distance of the electron is to reduce the thickness of the semiconductor film and thus, the distance the electron has to travel to reach an electrode. Disadvantageously, reduction in the thickness of the semiconductor film may reduce the light absorption in the dye, thereby reducing the efficiency of the solar cell.

Also, the injection of the electron from the dye into the semiconductor material leaves behind an oxidized dye cation. The oxidized dye is reduced by transfer of an electron from an iodide ion, leading to the production of triiodide that diffuse through the electrolyte solution to the back electrode where a catalyst supplies the missing electron thereby closing the circuit. The back electrode is generally carbonized or platinized to catalyze the electron transfer to the triiodide. The electrolyte solution is typically made in an organic solvent. Generally speaking, less volatile solvents, including ionic liquids, with a high boiling point are more viscous and impede the diffusion of ions to the point where the diffusion limits the power output and hence the efficiency of the solar cell. Such solvents may be advantageous in providing cell longevity, especially for cells fabricated on a polymer substrate, because polymer substrates may allow less viscous solvents having a low boiling point to diffuse out of the solar cell over time. Because the triiodide ion may originate from anywhere in the part of the electrolyte solution in contact with the dyed surface of the semiconductor, the ion may have to travel a long torturous path through the labyrinth created by the random pore structure of the semiconductor from near the front electrode to the back electrode to complete the circuit. These long paths may limit the diffusion current in the solar cell. Decreasing the travel distance of the ions may advantageously reduce the limitations caused by the slow diffusion of the ions. However, as previously described, reducing the thickness of the semiconductor film to reduce the ion transport path may disadvantageously reduce the light absorption of the dye.

Thus, while it may be advantageous to increase the thickness of the semiconductor film and thereby the surface area of the film to provide increased light absorption, the thicker the semiconductor film, the greater the distance the electrons and ions may have to travel to reach a respective electrode. Although longer light paths may be desirable to facilitate greater light absorption, the losses due to the increased recombination of the electrons into the semiconductor layer, as well as limits to current caused by slow ion diffusion through the electrolyte in the semiconductor pores, make the increased thickness of the semiconductor film disadvantageous since it may produce a less efficient solar cell.

BRIEF DESCRIPTION OF THE INVENTION

In accordance with one aspect of the present techniques, there is provided a solar cell comprising: a first electrode having a first planar surface; a second electrode having a second planar surface and comprising a plurality of fingers extending from the planar surface of the second electrode and in a direction toward the planar surface of the first electrode; and a dye-sensitized semiconductor material provided between the first electrode and the second electrode, wherein the dye-sensitized semiconductor material is provided about the plurality of fingers.

In accordance with another aspect of the present techniques, there is provided a solar cell comprising: a first electrode having a first planar surface and comprising a first plurality of fingers extending from the first planar surface; a second electrode having a second planar surface and comprising a second plurality of fingers extending from the second planar surface, wherein each of the second plurality of fingers are interdigitated with the first plurality of fingers; and a dye-sensitized semiconductor material provided between the first electrode and the second electrode, wherein the dye-sensitized semiconductor material is provided about each of the first plurality of fingers and the second plurality of fingers.

In accordance with a further aspect of the present techniques, there is provided a method of manufacturing a solar cell comprising the acts of: forming a first electrode having a plurality of conductive fingers; disposing a porous semiconductor material onto the first substrate and about the plurality of conductive fingers; forming a second electrode; coupling the first electrode to the second electrode; covering the surface of the porous semiconductor material with a dye; and disposing an electrolyte solution onto the porous semiconductor material.

In accordance with still another aspect of the present techniques, there is provide a method of manufacturing a solar cell comprising the acts of: forming a first plurality of fingers in a substrate; disposing a transparent conductive oxide (TCO) layer over the substrate and the first plurality of fingers; disposing a porous semiconductor material over the transparent conductive oxide (TCO) layer, wherein the semiconductor material is disposed at a thickness greater than the height of the first plurality of fingers; forming a plurality of channels in the porous semiconductor material, wherein each of the plurality of channels is formed between adjacent of the first plurality of fingers; disposing a porous insulative layer over the porous semiconductor material such that the porous insulative layer covers walls of the channels; and disposing a conductive material over the porous insulative layer such that the conductive layer completely fills the channels to form a second electrode comprising a second plurality of fingers.

BRIEF DESCRIPTION OF THE DRAWINGS

Advantages and features of the invention may become apparent upon reading the following detailed description and upon reference to the drawings in which.

DETAILED DESCRIPTION OF SPECIFIC EMBODIMENTS

Figure 1:
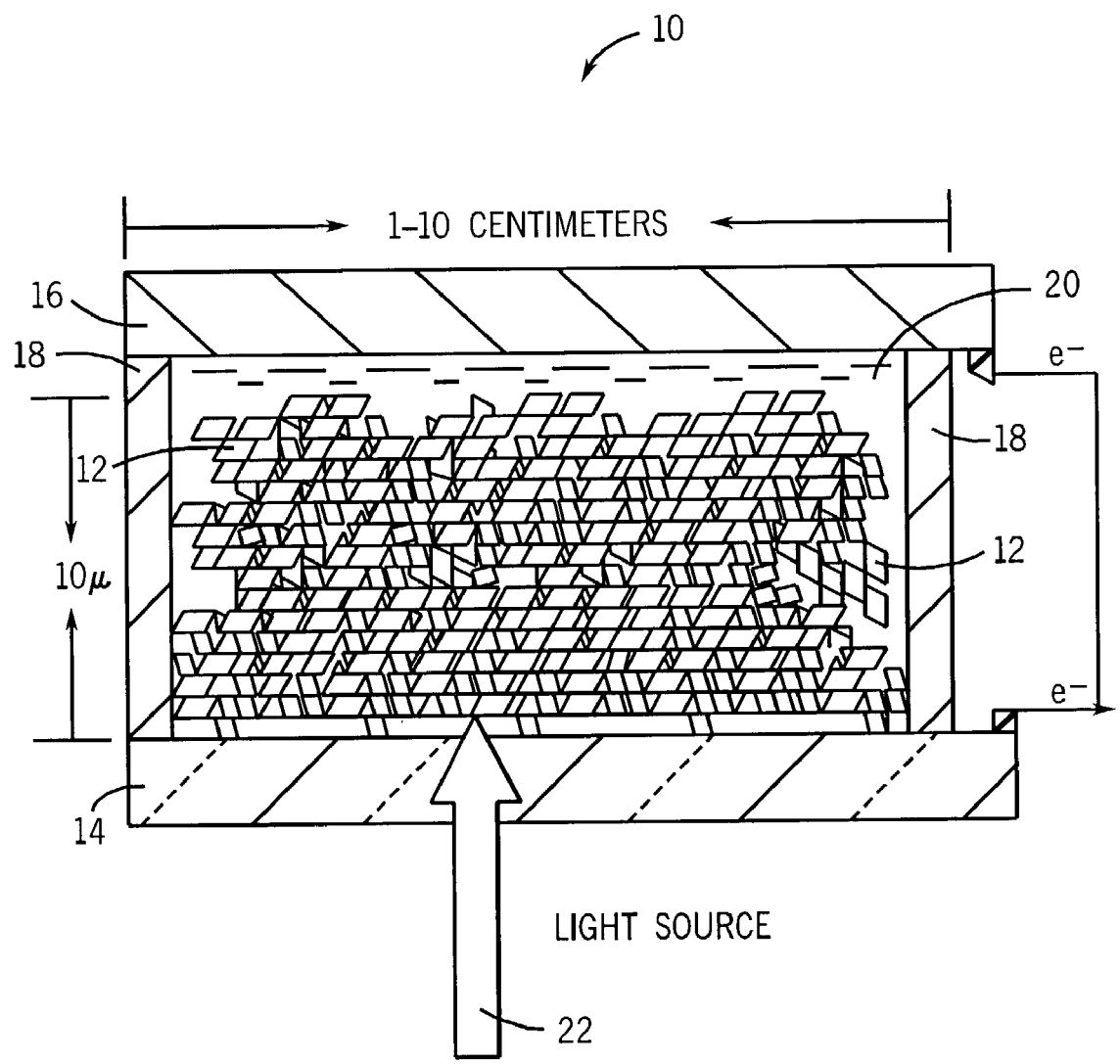
FIG. 1 illustrates a cross-sectional view of an exemplary embodiment of a dye-sensitized solar cell.

FIG. 1 illustrates an exemplary embodiment of a dye-sensitized solar cell 10. As can be appreciated, the solar cell 10 may be constructed by implementing planar layered structures. The solar cell 10 may be fabricated by implementing any one of a number of techniques and using a variety of materials, as can be appreciated by those skilled in the art. In one embodiment, a layer of semiconductor material, such as a layer of nanocrystalline titanium dioxide ($TiO_2$) 12 may be disposed on a transparent substrate 14, such as a glass substrate. The substrate 14 is coated with a conductive layer such as a transparent conducting oxide (TCO) layer. The TCO coated transparent substrate 14 forms the front electrode of the solar cell 10. As can be appreciated, the substrate 14 may comprise other transparent materials such as plastic. The $TiO_2$ layer 12 may be disposed at a thickness in the range of 5–20 microns, for example. The $TiO_2$ layer 12 is generally disposed at a thickness of at least 10 microns to facilitate efficient light absorption, as explained further below. The $TiO_2$ layer 12 of the exemplary solar cell 10 has a thickness of approximately 10 microns, as illustrated in FIG. 1. The $TiO_2$ layer 12 may be sintered or dried and pressed or chemically modified to provide mechanical strength, electrical conductivity and adherence to the substrate.

A back electrode 16 may be positioned on top of the $TiO_2$ layer 12. The back electrode 16 may be coated with a platinized TCO layer. The back electrode 16 may be positioned such that a small space (one micron, for example) is provided between the $TiO_2$ layer 12 and the back electrode 16. Accordingly, minimal contact points (or no contact points, as in the present exemplary embodiment) may exist between the $TiO_2$ layer 12 and the back electrode 16. A seal 18, such as an organic material or glass for instance, is provided to seal the edges of the solar cell 10. As can be appreciated, while the height of the solar cell 10 may be in the range of 5–20 microns, the lateral dimension of the solar cell 10 (i.e. between each of the seals 18) may be in the range of 0.5–10 centimeters, for instance. The lateral dimension of the exemplary solar cell 10 is illustrated as having an exemplary range of approximately 1–10 centimeters, for example.

The back electrode 16 may include filling holes (not shown) through which a solution of dye suitable for sensitizing the titanium oxide layer 12 can be injected. As can be appreciated by those skilled in the art, the dye used to saturate and sensitize the $TiO_2$ layer 12 may include group VIII metal complexes of bipyridine carboxylic acids, such as $Ru(4,4'\text{-dicarboxy-2,2'-bipyridyl})_2(SCN)_2$, for instance. Once the $TiO_2$ layer 12 is saturated, the dye-coated $TiO_2$ layer 12 may be rinsed and cleaned, as can be appreciated by those skilled in the art. An electrolyte layer 20 is injected through the filling holes in the back electrode 16 to fill the pores in the semiconductor film and the remaining space between the glass substrate 14 and the back electrode 16. The electrolyte layer 20 facilitates the movement of ions formed by a separation of electrons in the dye sensitized $TiO_2$ layer 12 upon exposure by an incident light source 22, such as sunlight, as explained further below. Finally, the filling holes may be sealed and electrical contact is made between the glass substrate 14 and the back electrode 16.

As illustrated with respect to FIG. 1, the light path through the sensitized $TiO_2$ layer 12 is approximately 10 microns. When an incident light source 22 is directed through the glass substrate 14, the incident light excites electrons within the dye, and the electrons are transferred into the $TiO_2$ layer 12. The electrons migrate through the adjacent crystals in the $TiO_2$ layer 12 through a "random walk." While the maximum distance of any of the particles in the $TiO_2$ layer 12 is approximately 10 microns from the glass substrate 14, the distance an electron may travel through the $TiO_2$ layer 12 to reach the glass substrate 14 may be significantly greater than 10 microns as the electron randomly migrates through adjacent nanocrystals in the $TiO_2$ layer 12. During the random walk of the electron to the glass substrate 14, the electron may be lost by combining with a component of the electrolyte layer 20. In general, the longer it takes for an electron to diffuse through the $TiO_2$ layer 12 to the underlying TCO coated substrate 14, the more likely that the electron will disadvantageously recombine. Under irradiation by sunlight the density of the electrons in the $TiO_2$ layer 12 may be high enough that the losses significantly reduce the maximum voltage and therefore the efficiency achievable by the solar cell 10. As previously discussed, reducing the thickness of the $TiO_2$ layer 12 to reduce the likelihood of electron recombination during the random walk by decreasing the migration path of the electrons is disadvantageous, because reducing the thickness of the $TiO_2$ layer 12 reduces the light absorption potential of the $TiO_2$ layer 12.

Further, ions formed by reaction of components of the electrolyte with dye molecules which have injected excited electrons into the semiconductor migrate to the back electrode 16 through the electrolyte 20 to complete the circuit. Because the $TiO_2$ layer 12 is "porous" and therefore comprises a continuous system of pores, ions in the electrolyte 20 can diffuse through the $TiO_2$ layer 12. In the present exemplary embodiment, the maximum distance from any ion to the back electrode 16 is the thickness of the $TiO_2$ layer 12 plus the additional space between the $TiO_2$ layer 12 and the back electrode 16. In the present exemplary embodiment, the maximum distance from any ion to the back electrode is approximately 11 microns. As previously described, the electrolyte layer 20 is typically an organic solvent. While polar, stable and non-viscous solvents are desirable, the solvents implemented in the solar cell 10 such as acetonitrile, are generally volatile. Generally speaking, less volatile solvents are more viscous and impede the diffusion of ions to the point where the diffusion limits the power output and therefore the efficiency of the solar cell 10. In solar cells 10 implementing a plastic substrate 14, the loss of volatile solvents may create even more of a problem.

In summary, the solar cell 10 of FIG. 1 includes a $TiO_2$ layer 12 coated with dye and disposed at a thickness of about 10 microns onto a TCO coated planar substrate 14. A platinized TCO coated glass substrate provides the back electrode 16. The $TiO_2$ layer 12 is in direct contact with the glass substrate 14 to provide an electrical connection for the excited electrons, and the contact area is advantageously maximized to provide increased electron paths through the $TiO_2$ layer 12 to the substrate 14. Conversely, the contact area between the $TiO_2$ layer 12 and the back electrode layer 16 is minimized and in the present exemplary embodiment, does not exist (i.e. the $TiO_2$ layer 12 is electrically isolated from the electrode layer 16). The shortest light path through the $TiO_2$ layer 12 is 10 microns. Although longer light paths may be desirable to provide more light absorption, the losses due to increased recombination and from ion diffusion limitations make thicker layers of the solar cell 10 less efficient.

FIGS. 2–5 illustrate cross-sectional views of an exemplary technique for fabricating one embodiment of a dye-sensitized solar cell having finger electrodes in accordance with the present techniques. FIG. 6 illustrates a top plan view of the dye-sensitized solar cell of FIGS. 2–5. Generally speaking, the present techniques implement finger electrodes which allow the solar cell to maintain an adequate light path through the dye sensitized semiconductor layer while reducing the distances that the electrons travel through the semiconductor layer and/or by reducing the distance that the ions travel through the electrolyte. Advantageously, the present techniques reduce the recombination losses (i.e., electron losses from the semiconductor layer to a component of the electrolyte) and reduce diffusion losses in the electrolyte, thereby increasing the efficiency of the solar cell. Since the efficiency of the solar cell is a major consideration in the cost of the power produced by the cells, the techniques implementing the structured electrodes advantageously reduce the cost per watt delivered, as well.

Figure 2:
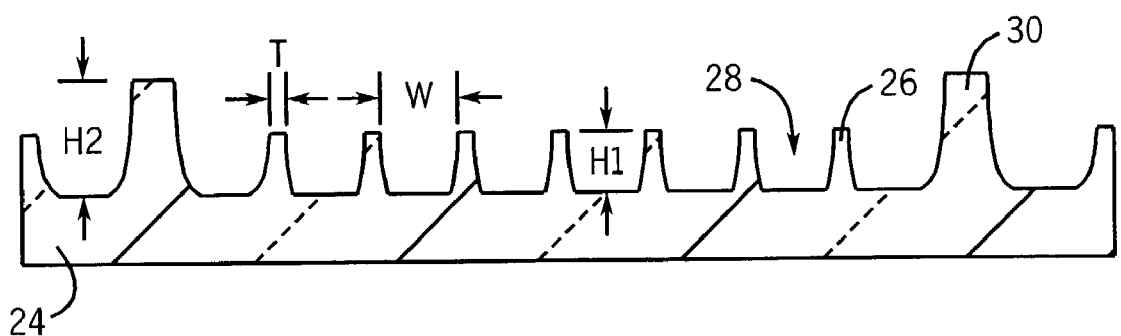
FIGS. 2–5 illustrate cross-sectional views of an exemplary technique for fabricating one embodiment of a dye-sensitized solar cell having finger electrodes in accordance with the present techniques.

Referring specifically to FIG. 2, a cross-sectional view of a substrate 24 is illustrated. The substrate 24 forms the back electrode of the present exemplary solar cell, as will be described further below. The substrate 24 may comprise any suitable conductive polymer, such as glass or plastic coated with a transparent conductive oxide (TCO) layer. Alternatively, the substrate 24 may comprise a conductive metal, such as a titanium (Ti) foil. The substrate 24 may be extruded, embossed or formed by a compression molding process, depending on the material used for the substrate 24, as can be appreciated by those skilled in the art. The substrate 24 includes a number of "fingers" 26. The fingers 26 generally refer to extensions from the planar surface of the substrate 24, as illustrated in FIG. 2. The fingers 26 extended approximately perpendicular to the surface of the substrate 24 and are spaced such that cavities 28 are formed between the fingers 26. As can be appreciated, in one exemplary embodiment, the cavities 28 form channels which are approximately perpendicular to the surface of the cross-section illustrated in FIG. 2, as will become apparent from the figures described below. Alternatively, the cavities 28 may be configured to form wells of any desirable shape between two or three fingers 26, for example. As used herein, "adapted to," "configured to," and the like refer to elements that are arranged or manufactured to form a specified structure or to achieve a specified result.

The fingers 26 may have a thickness T in the range of approximately 1–10 microns, for example. Further, the fingers 26 may have a height H1 in the range of approximately 1–50 microns, for example. In the present exemplary embodiment, the width W of the cavities 28 may be in the range of approximately 1–20 microns, for example. The substrate 24 may also include supporting elements 30 having a height H2 in the range of approximately 2–70 microns, for example. The supporting elements 30 are configured to provide support for the top electrode of the present exemplary solar cell, as will be described further below. However, as will be appreciated, the present techniques of incorporating fingers 26 in the solar cell may be implemented without providing supporting elements 30. While the dimensions of the structures of the substrate 24 may be within the above referenced ranges, the relationship of the structures may also be used to define particular design dimensions. For instance, the ratio of the thickness T of the fingers 26 to the width W of the cavities 28 (T/W) is preferably less than one. That is to say that the thickness T of the fingers 26 is less than the width W of the cavities 28. Further, the ratio of the height H1 of the fingers 26 to the height H2 of the supporting elements 30 (H1/H2) is less than one. That is to say, that the height H2 of the supporting elements 30 is greater than the height H1 of the fingers 26.

Figure 3:
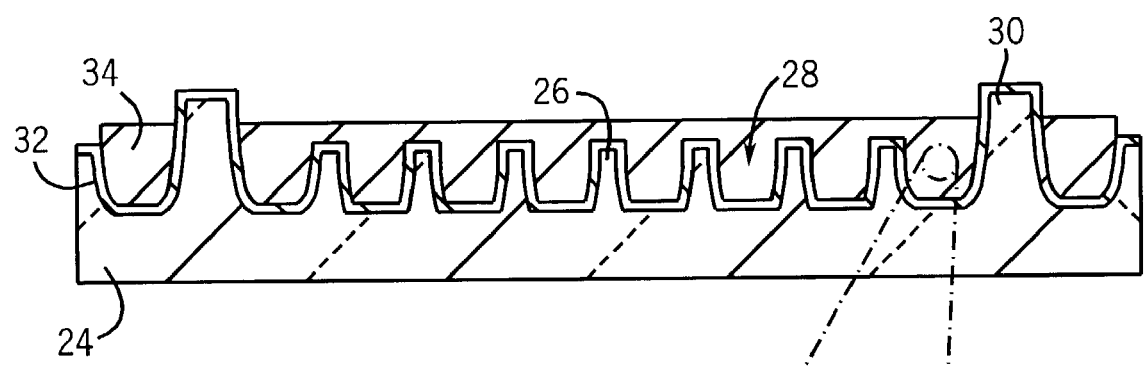

After formation of the substrate 24 having fingers 26 and cavities 28, a reflective coating 32 may be disposed over the surface of the substrate 24, as illustrated in FIG. 3. The reflective coating 32 may be disposed via a sputtering process and may comprise titanium (Ti), for example. Alternatively, if the substrate 24 comprises a reflective material such as titanium (Ti), the reflective coating 32 may be omitted. As can be appreciated, since the substrate 24 is configured to form the back electrode of the exemplary solar cell, as illustrated further below, a reflective coating 32 may be implemented to reflect incident light back into the cell to increase light absorption.

A semiconductor material 34 is disposed on the substrate 24. The semiconductor material 34 may comprise titanium oxide ($TiO_2$) or zinc oxide (ZnO), for example. The semiconductor material 34 generally comprises a porous film having a nano-crystalline structure, as best illustrated in the exploded view of FIG. 3. The nano-crystals of the semiconductor material 34 may have a diameter in the range of approximately 10–400 nanometers for example. The semiconductor material 34 is generally disposed such that the semiconductor material 34 completely covers the fingers 26. Accordingly, the semiconductor material 34 may be disposed at a thickness of greater than 1–50 microns, but less than the height H2 of the supporting elements 30. The semiconductor material 34 may be disposed as a paste that is then dried and sintered at a high temperature to increase mechanical strength, electrical conductivity and adherence to the substrate 24. Alternately, the semiconductor material 34 may be pressed, chemically treated or treated by other techniques to increase mechanical strength, electrical conductivity and adherence, as can be appreciated by those skilled in the art. The semiconductor material 34 is coated with a solution of dye suitable for sensitizing the semiconductor material 34. The dye used to saturate and sensitize the semiconductor material 34 may include group VIII metal complexes of bipyridine carboxylic acids, such as Ru(4,4'-dicarboxy-2,2'-bipyridyl)$_2$(SCN)$_2$, for instance. Once the semiconductor material 34 is saturated, the dye-coated semiconductor material 34 may be rinsed and cleaned, as can be appreciated by those skilled in the art.

Figure 4:
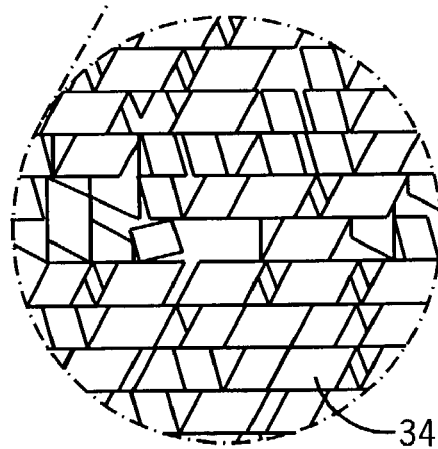
Figure 4:
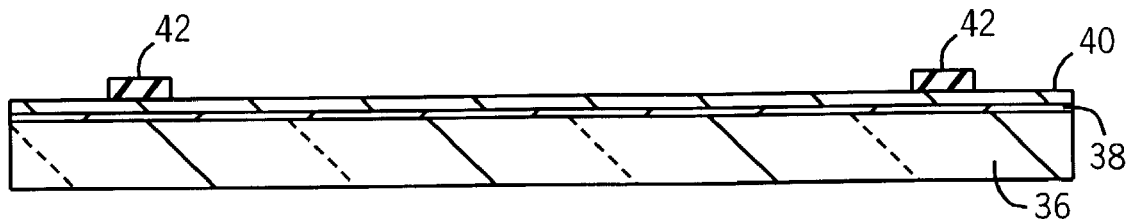

FIG. 4 illustrates a cross-sectional view of a top electrode 36. The top electrode may comprise a transparent material, such as a polymer or glass, that is weather resistant since it may be exposed to external elements to receive incident sunlight. The top electrode 36 is generally coated with a transparent conducting oxide (TCO) layer 38, such as indium tin oxide (ITO) or fluorinated tin oxide (F—SnO2), for example. Further, the top electrode 36 may be platinized. That is to say that a layer of platinum 40 may be disposed on the TCO layer 38 to provide a catalyst for the electron transfer to the oxidant in the electrolyte solution, as previously described, and described further below. As can be appreciated, the catalyst may comprise a carbon layer or a graphite layer, rather than the platinum 40, depending on the oxidant formed in the electrolyte solution. An insulative bonding material 42 is disposed on the layer of platinum 40. The bonding material 42 comprises an adhesive dielectric. The bonding material 42 is disposed such that it aligns with the supporting elements 30 of the substrate 24, as best illustrated with reference to FIG. 5. The bonding material 42 may be used to secure the top electrode 36 to the substrate 24.

Figure 5:
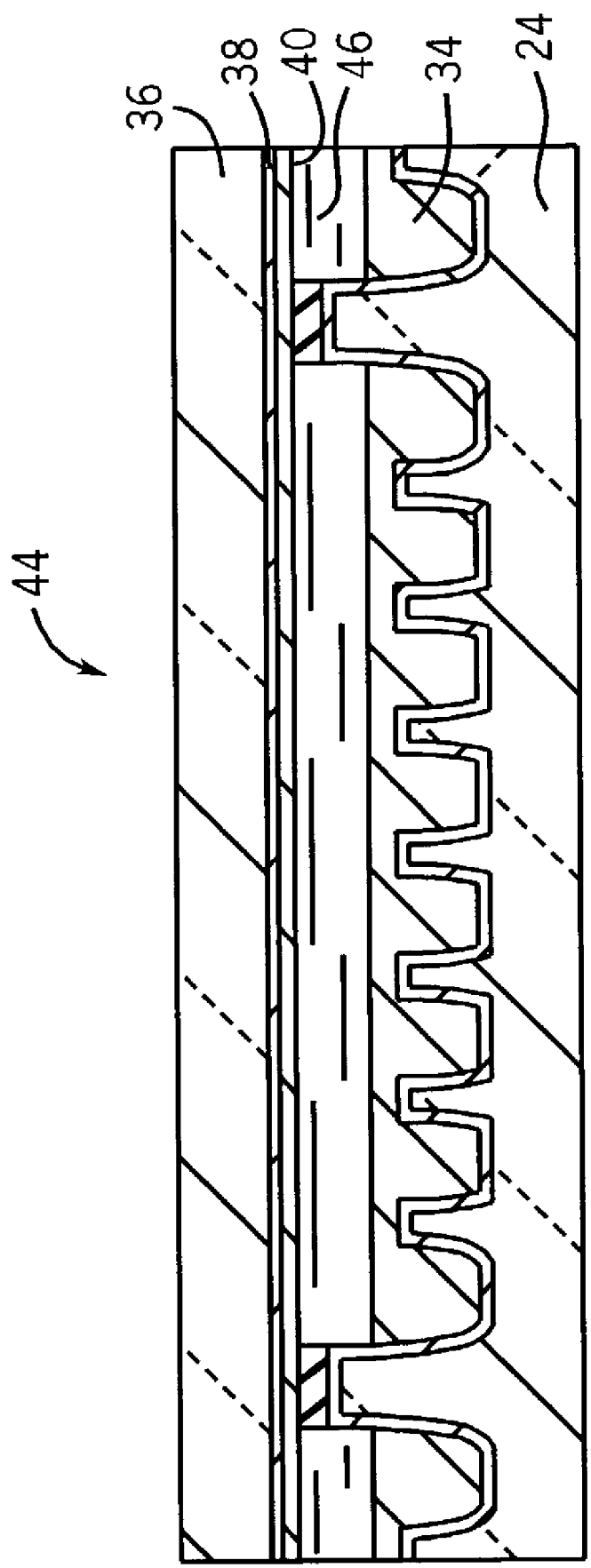
Figure 6:
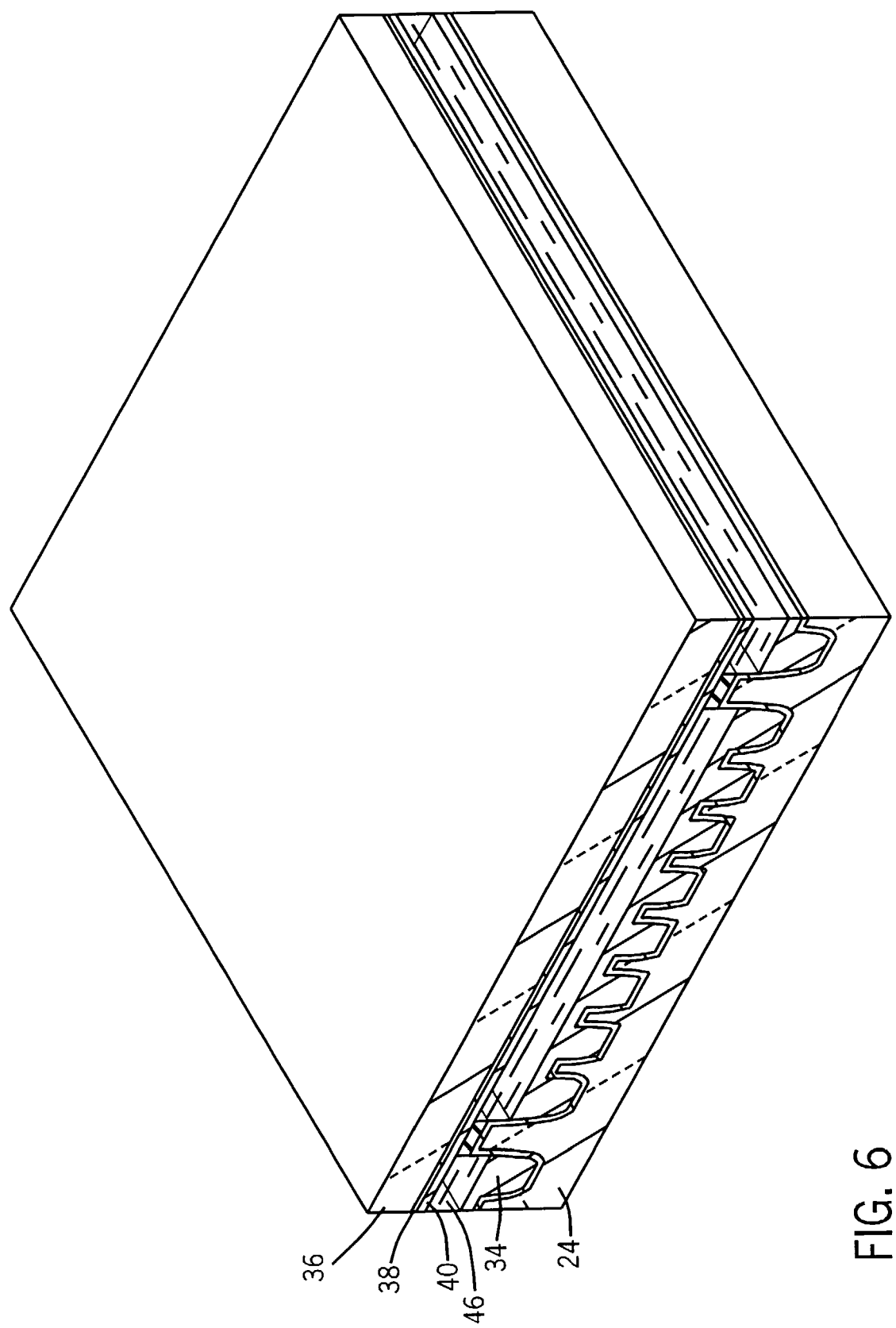
FIG. 6 illustrates a top plan view of a dye-sensitized solar cell having finger electrodes in accordance with one embodiment of the present techniques.

FIG. 5 illustrates a cross-sectional view of a solar cell 44 in accordance with one embodiment of the present techniques. The top electrode 36 is attached to the substrate 24 via the bonding material 42. As illustrated in FIG. 5, the bonding material 42 is aligned such the bonding material 42 may be coupled to the supporting elements 30. An electrolyte solution 46 may be injected into the remaining space between the top electrode 36 and the substrate 24. The electrolyte solution 46 not only fills the remaining space between the top electrode 36 and the substrate 24 but also fills the porous areas separating the individual crystals of the semiconductor material 34. The electrolyte solution 46 generally includes iodide and/or triiodide salts in an organic solvent. The iodide in the electrolyte solution 46 provides the reductant for the cation produced by the excitation of an electron in the dye upon exposure to an incident light source. Further, the electrolyte solution 46 may include additives, as can be appreciated by those skilled in the art.

As can be appreciated, the improved solar cell 44 functions in a manner similar to conventional solar cells but having improved performance. As previously described, once light from an incident light source is directed through the top electrode 36, it is absorbed by the dye in the dye-sensitized semiconductor material 34. The absorption of the light produces excited electrons in the dye which are injected into the nano-crystals of the dye-sensitized semiconductor material 34. The excited electrons migrate to the substrate 24 (such as to the fingers 26) and are collected in the external circuit of the solar cell 44. The dye molecule which injected the electron into the semiconductor material 34 then accepts an electron from the reductant in the electrolyte solution 46, such as iodide, thereby leaving an oxidant, such as triiodide. The platinum layer 40 provides the counter electrode for the solar cell 44. The oxidant diffuses through the electrolyte solution 46 to the platinum layer 40 where it accepts electrons from the external circuit of the solar cell 44, thereby producing electrical current and completing the photovoltaic effect.

One advantage of the present exemplary solar cell 44 incorporating fingers 26 is the reduction in the maximum distance from any point in the semiconductor material 34 to the back electrode (i.e. the fingers 26 of the substrate 24). For example, the maximum straight line distance that an electron must migrate through the semiconductor material 34 has been reduced from 10 or more microns in a standard cell design, such as the solar cell 10 of FIG. 1, to substantially less, as in the present exemplary solar cell 44. For instance, if the width W of the cavities 28 is 5 microns, the longest straight line path from any of the nano-crystals of the semiconductor layer 34 to the substrate 24 (including fingers 26) is only about 2.5 microns. As previously discussed, reducing the electron travel path in the solar cell 44 reduces the likelihood of electron losses due to recombination, thereby resulting in a more efficient solar cell. A top plan view of the exemplary solar cell 44 is illustrated in FIG. 6. A sealing layer (not illustrated) may also be implemented to seal the edges of the solar cell 44, as can be appreciated by those skilled in the art.

FIGS. 7–15 illustrate cross-sectional views of an exemplary method of fabricating an alternate embodiment of a solar cell implementing the present techniques. Specifically, the solar cell illustrated in FIGS. 7–15 implement "interdigitated" finger electrodes. That is to say that the solar cell illustrated with reference to FIGS. 7–15 implements a top electrode having finger structures, as well as a bottom electrode having finger structures. The electrodes are arranged so that the finger structures are alternated, as further described below. The present embodiment implements interdigitated finger electrodes that allow the solar cell to maintain an adequate light path through the dye sensitized semiconductor layer while reducing the distances that the electrons travel through the semiconductor layer and by reducing the distance that the ions travel through the electrolyte. Advantageously, the present techniques reduce the recombination losses (i.e., electron losses from the semiconductor layer to a component of the electrolyte) and reduce diffusion losses in the electrolyte, thereby increasing the efficiency of the solar cell. Since the efficiency of the solar cell is a major consideration in the cost of the power produced by the cells, the techniques implementing the interdigitated finger electrodes advantageously reduce the cost per watt delivered, as well.

Figure 7:
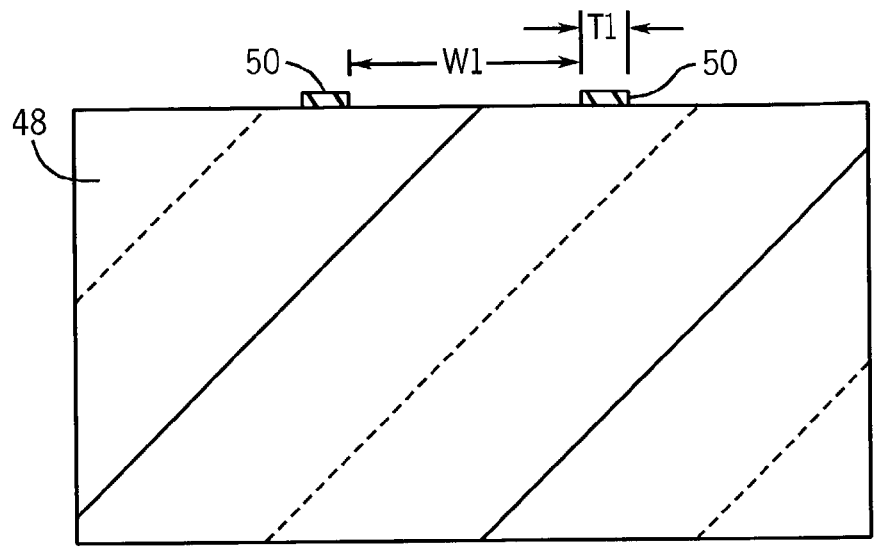
FIGS. 7–15 illustrate cross-sectional views of an exemplary technique for fabricating one embodiment of a dye-sensitized solar cell having interdigitated finger electrodes in accordance with the present techniques.

Referring specifically to FIG. 7, a cross sectional view of a substrate 48 is illustrated. The substrate 48 may comprise glass, for example. Alternatively, the substrate 48 may comprise a polymer. The vertical thickness of the substrate 48 may be in the range of approximately 2–50 microns, for example. A masking layer 50 is disposed, patterned and rinsed to provide strips to facilitate the formation of fingers in the substrate 48. Accordingly, strips of the masking layer 50 are formed having a thickness T1 in the range of approximately 1–10 microns, for example. Each strip of the masking layer 50 may be spaced a width W1 from the next adjacent strip of the masking layer 50. The width W1 may be in the range of approximately 1–20 microns, for example. The masking layer 50 is generally a material that is resistant to plasma etching, such as nickel, and may be disposed by a sputtering technique, for example.

Figure 8:
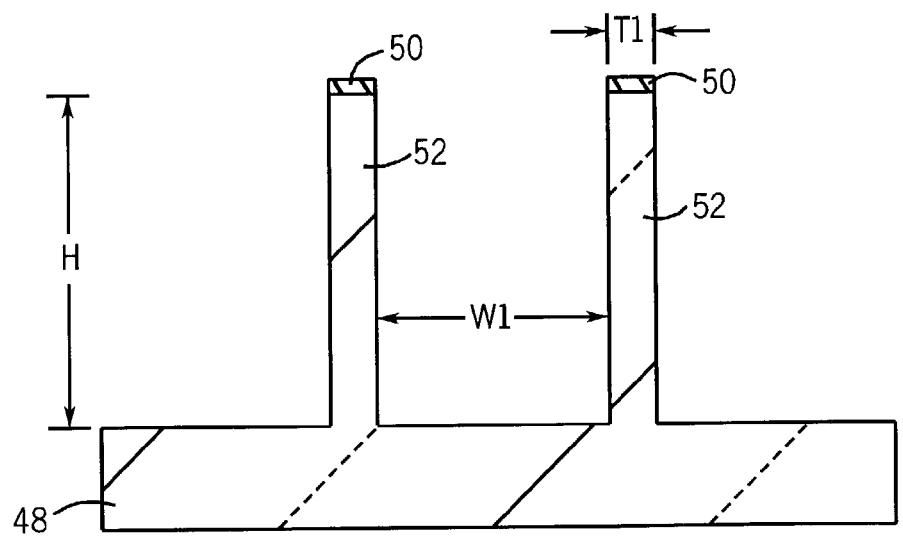

Next, the substrate 48 is etched, as illustrated in FIG. 8. As can be appreciated, the areas of the substrate 48 which are not covered by the masking layer 50 are removed to form fingers 52 in the substrate 48. Accordingly, the fingers 52 have a thickness T1 and a width W1 between each of the fingers 52, as described above with reference to the strips of the masking layer 50 in FIG. 7. The ratio of the thickness T1 of the fingers 52 to the width W (T1/W1) is preferably less than one. That is to say that the thickness T1 of the fingers 52 is less than the width W1 between each of the fingers 52. While the present exemplary embodiment illustrates fingers 52 that are have a relatively uniform thickness T1 from top to bottom, the fingers 52 may actually be thicker at the base (closest to the planar surface of the substrate 48) than at the top, for example. The height H of the fingers 52 may be in the range of approximately 1–50 microns, for example. Alternatively, rather than etching the substrate 48, the substrate 48 may be extruded, embossed or formed by a compression molding process to form the fingers 52, depending on the material used for the substrate 48, as can be appreciated by those skilled in the art.

Figure 9:
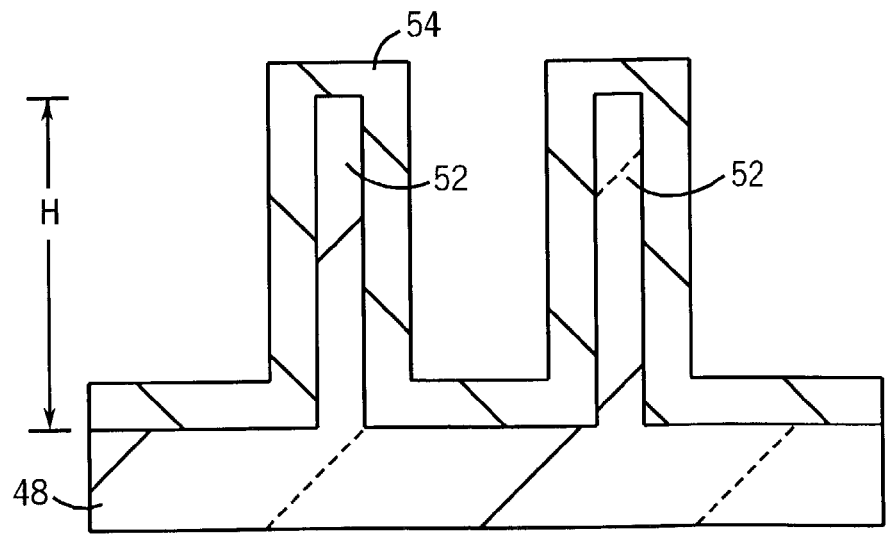

After etching (or otherwise forming) the fingers 52 in the substrate 48, the masking layer 50 is removed, via a chemical rinse, for example. Next, the substrate 48 is coated with a transparent conductive oxide (TCO) layer 54, such as fluorinated tin oxide (F—$SnO_2$) for example, as illustrated in FIG. 9. The substrate 48 is coated with the TCO layer 54 such that the fingers 52 and the space between the fingers 52 are covered by the TCO layer 54. The fingers 52 coated with the TCO layer 54, form the front electrode of the present exemplary solar cell, as will be described further below. The thicknesses of the fingers 52 and the TCO layer 54 are not drawn to scale. As can be appreciated, the TCO layer 54 may be considerably thinner than the fingers 52, for example.

Figure 10:
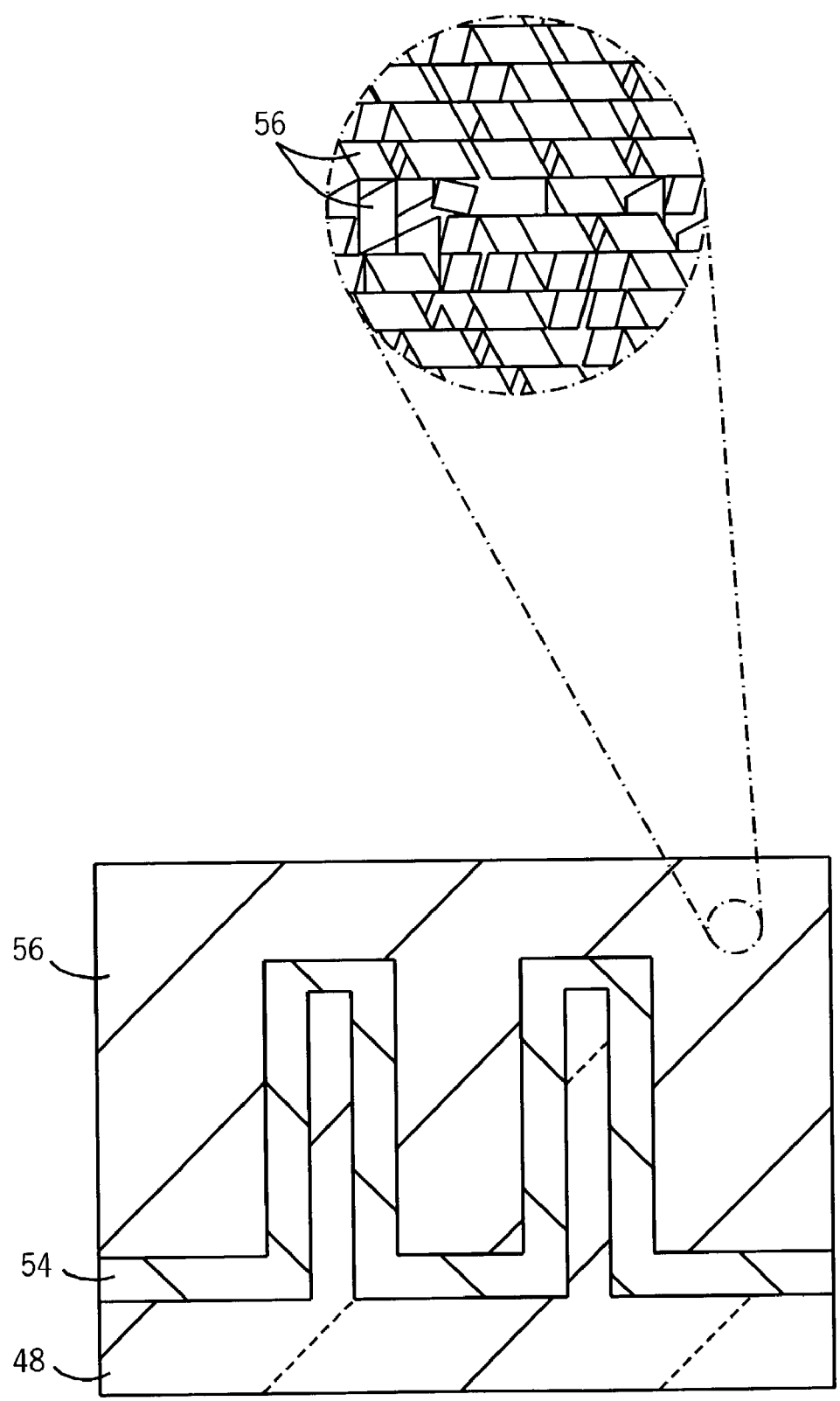

A semiconductor material 56 is disposed over the TCO layer 54, as illustrated in FIG. 10. The semiconductor material 56 may comprise titanium oxide ($TiO_2$) or zinc oxide (ZnO), for example. The semiconductor material 54 generally comprises a porous film having a nano-crystalline structure, as best illustrated in the exploded view of FIG. 10. The nano-crystals of the semiconductor material 56 may have a diameter in the range of approximately 10–400 nanometers, for example. The semiconductor material 56 is generally disposed such that the semiconductor material 56 completely covers the TCO layer 54 and fills the intervening areas between each of the fingers 52. Accordingly, the semiconductor material 56 may be disposed at a thickness of greater than 1–50 microns. The semiconductor material 56 may be disposed as a paste that is then dried and sintered at a high temperature to increase mechanical strength, coherence, electrical conductivity and adherence to the TCO layer 54. Alternately, the semiconductor material 56 may be pressed, chemically treated or treated by other techniques to increase mechanical strength, coherence, electrical conductivity and adherence, as can be appreciated by those skilled in the art. After treatment, the semiconductor material 56 forms a layer having a plurality of nano-crystals and nano-pores, as best illustrated in the exploded view. The nano-pores will eventually be filled with an electrolyte solution, as previously described and as further described below.

Figure 11:
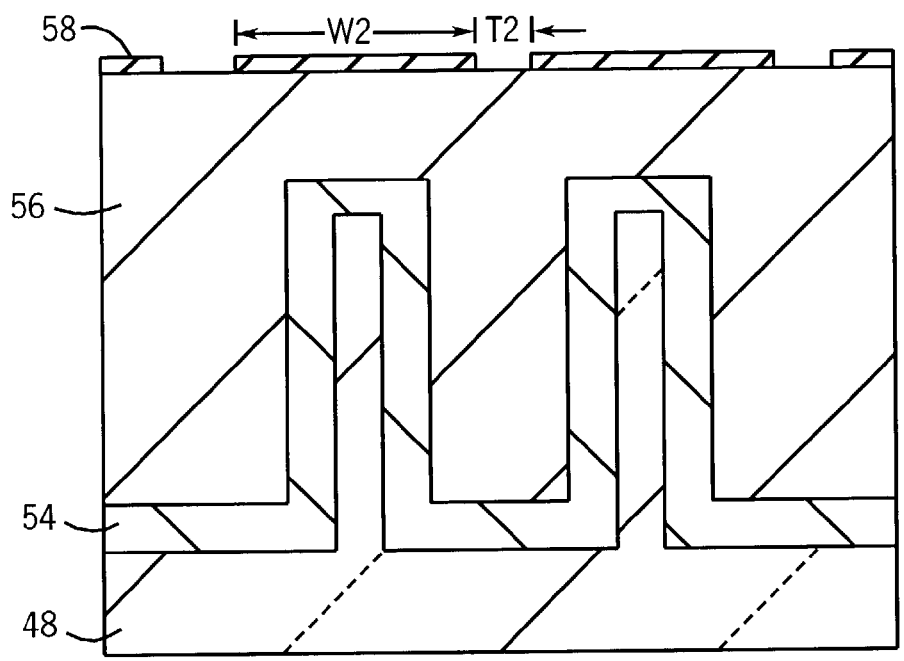

To create a solar cell having interdigitated finger electrodes in accordance with one embodiment of the present techniques, a second masking layer 58 is deposited on the semiconductor material 56, as illustrated in FIG. 11. The masking layer 58 is generally resistant to plasma etching, such as nickel, and may be disposed by a sputtering technique, for example. The masking layer 58 is patterned to define a number of structured channels that will be formed in the semiconductor material 56 between each of the fingers 52 of the substrate 48. Accordingly, the pattern of the masking layer 58 will be dictated somewhat by the thickness T1 of the fingers 52 and the width W1 between the fingers 52 formed in the substrate 48.

In the present exemplary embodiment, the masking layer 58 is patterned such that openings having a thickness T2 are formed. The width between each of the openings in the masking layer 58 is represented by the width W2. As can be appreciated, the thickness T2 of the opening in the masking layer 58 is less than the width W1 between each of the fingers 52 in the substrate 48. The openings in the masking layer 58 define exposed regions in the semiconductor material 56, which can be etched, as further described below. In the present exemplary embodiment, the masking layer 58 is patterned to facilitate the formation of channels between each of the fingers 52. In one exemplary embodiment, the thickness T2 is approximately 1 micron and the width W2 is approximately 4 microns. As can be appreciated, the aperture widths in the masking layer 58 and the spacing between the apertures may be adjusted to facilitate the formation of channels having alternate widths and alternate spacing, within the dimensions defined by the fingers 52.

Figure 12:
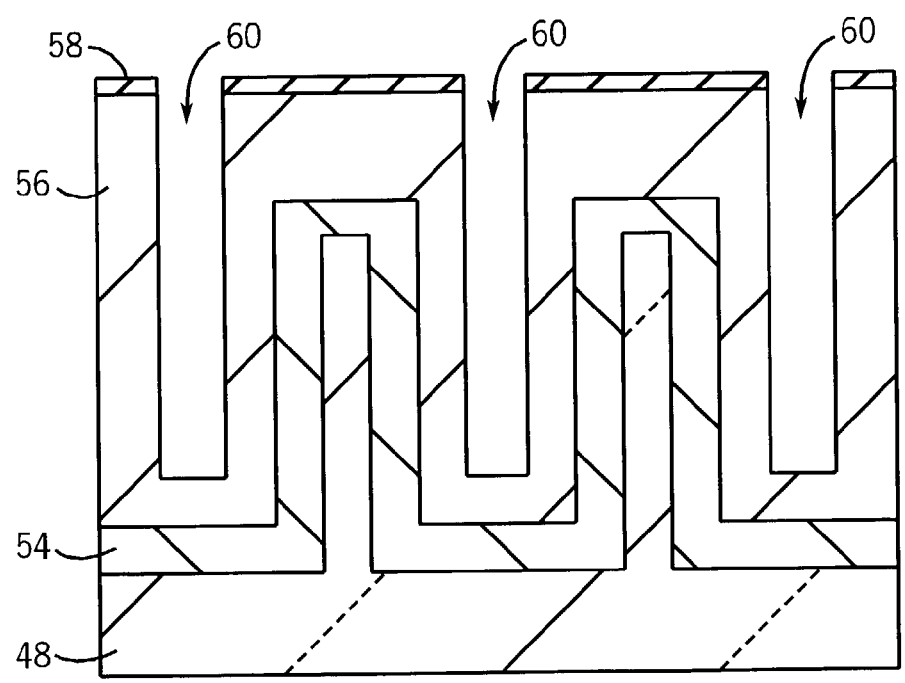

FIG. 12 illustrates the formation of the channels 60 between each of the fingers 52 of the substrate 48. As previously described, the apertures in the masking layer 58 define openings that can be etched in the semiconductor material 56. In one exemplary embodiment, the channels 60 are etched by a dry plasma etch process, for example. Alternatively, a wet chemical etch may be used to form the channels 60. As can be appreciated, the material chosen for the masking layer 58 may vary depending on the etch process and the etchant that are implemented to form the channels 60. As further discussed below, the etch process is timed such that the channels 60 do not extend entirely through the semiconductor material 56, as illustrated in FIG. 12. Accordingly, after etching the channels 60, a portion of the semiconductor material 56 remains between the bottom of the channels 60 and the TCO layer 54.

Figure 13:
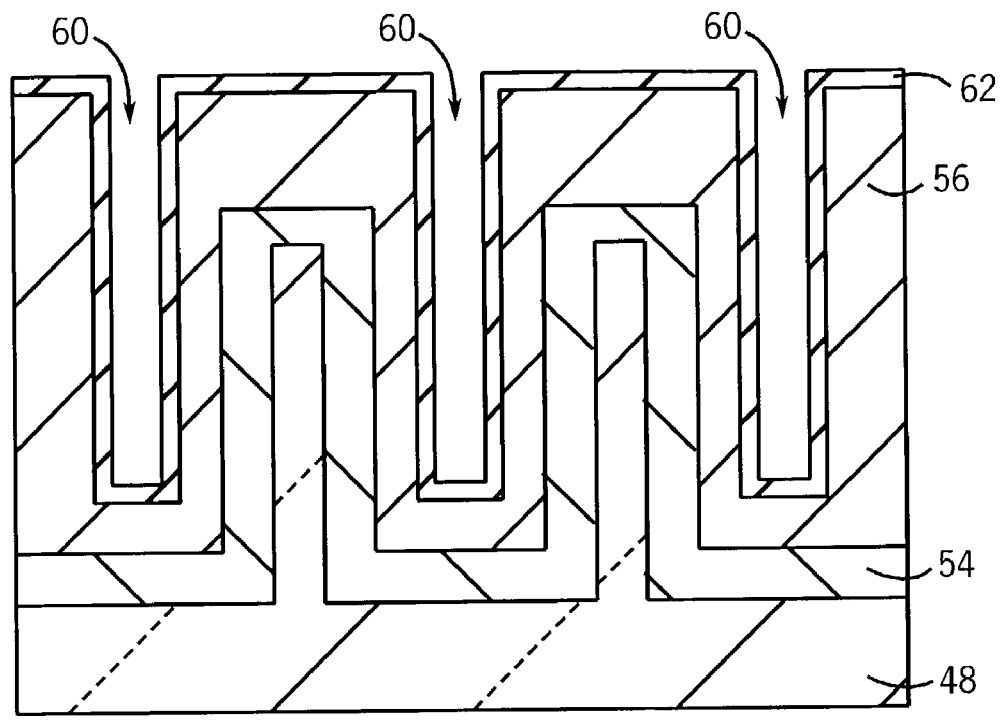

After the channels 60 have been etched in the semiconductor material 56, the masking layer 58 is removed via a chemical rinse, for example. Next, a thin insulative layer 62 is coated over the exposed surface of the semiconductor material 56, as illustrated in FIG. 13. The insulative layer 62 is disposed such that the walls within the channels 60 are completely coated with the insulative layer 62. The insulative layer 62 may be disposed by chemical vapor deposition (CVD), for example. The insulative layer 62 generally comprises a porous, non-conductive material. Because the insulative layer 62 is "porous" and therefore comprises a continuous system of pores, ions in the electrolyte solution (described above and illustrated further below) can advantageously diffuse through the insulative layer 62. The insulative layer 62 may be an alumina, such as $Al_2O_3$, or a silica, such as $SiO_2$, for example. The insulative layer 62 is advantageously porous to allow the oxidant ions, such as triiodide ions, to diffuse through the insulative layer 62, as discussed further below.

Figure 14:
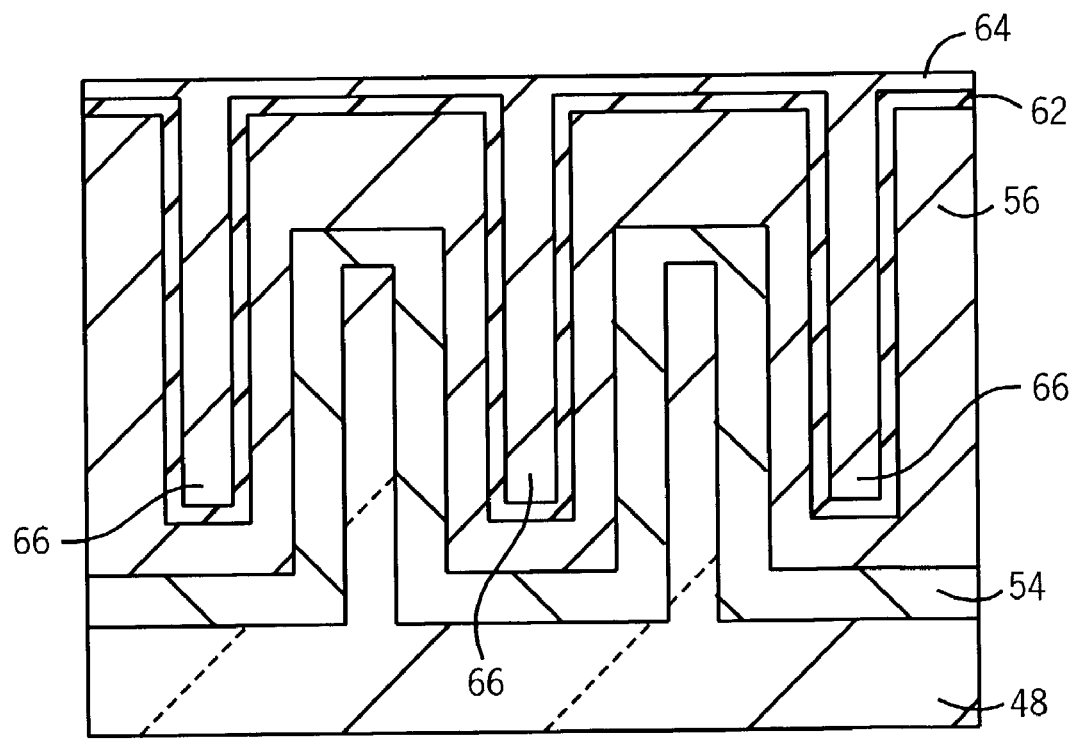
Figure 15:
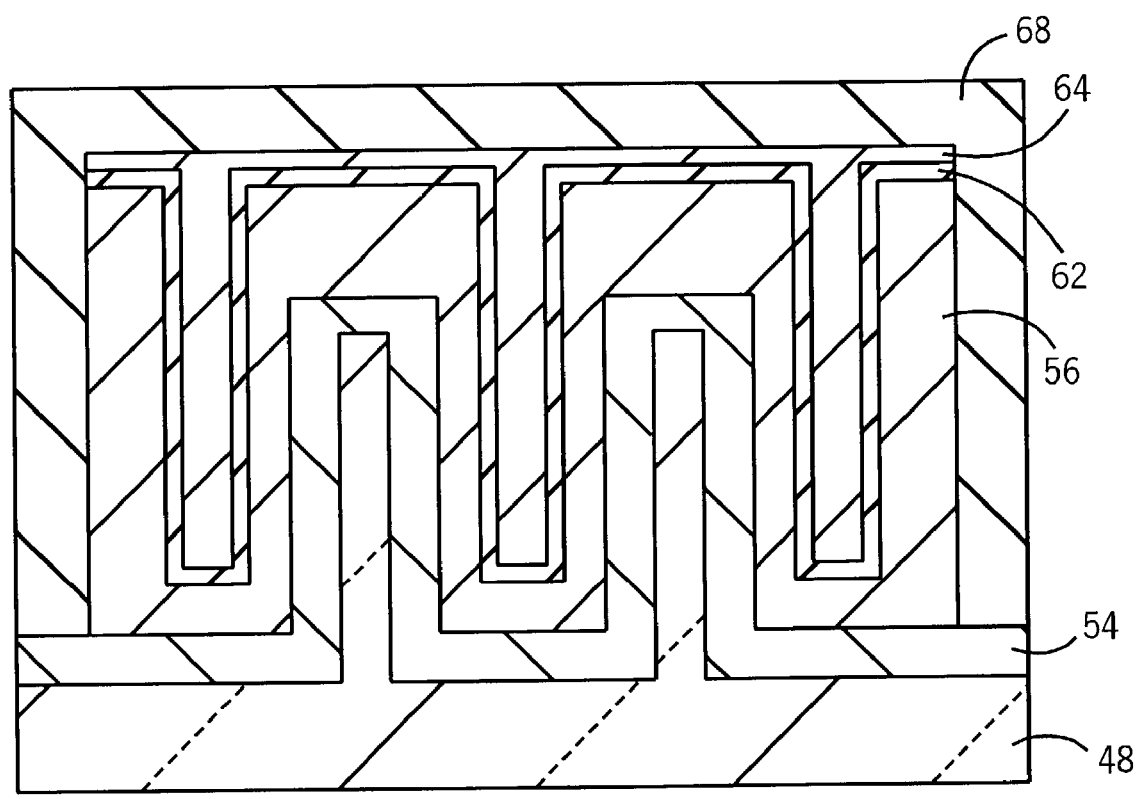

Next, the surface of the structure is platinized. That is to say, a thin platinum layer 64 is disposed over the insulative layer 62, as indicated in FIG. 14. The platinum layer 64 is disposed such that it covers the insulative layer 62 and completely fills the channels 60. The platinum layer 64 forms the back electrode of the solar cell having a plurality of fingers 66. The fingers 66 of the platinum layer are "interdigitated" with the fingers 52 of the front electrode. That is to say that the fingers 66 are alternated between the fingers 52, thereby forming opposing comb-like structures that are interdigitated together, as illustrated in FIG. 14.

As previously described and further discussed below, ions formed by reaction of components of an electrolyte with dye molecules which have injected excited electrons into the semiconductor material 56 diffuse to the platinum layer 64 of the solar cell. The platinum layer 64 provides the catalyst for electron transfer from the oxidant in the electrolyte (previously discussed and discussed further below), such as triiodide, to complete the circuit of the solar cell. As can be appreciated, the catalyst may comprise a carbon layer or a graphite layer, rather than the platinum layer 64, depending on the oxidant formed in the electrolyte solution.

After deposition of the platinum layer 64, the semiconductor material 56 is coated with a monolayer of dye, thereby forming a dye-sensitized semiconductor material 56. As can be appreciated, by sensitizing the semiconductor material 56 with a dye, a reactive element is formed wherein a single layer of dye molecules is attached to each nanocrystal of the semiconductor material 56. The dye solution may be introduced to the semiconductor material 56 by a conventional means of pumping an organic solvent comprising the die solution through the semiconductor material 56 from one of the exposed edges of the semiconductor material 56. As previously described, the dye used to saturate and sensitize the semiconductor material 56 may include group VIII metal complexes of bipyridine carboxylic acids, such as $Ru(4,4'-dicarboxy-2,2'-bipyridyl)_2(SCN)_2$, for instance. Once the dye is pumped through the semiconductor material 56, the dye-sensitized semiconductor material 56 may be cleaned and dried, as can be appreciated by those skilled in the art.

Next, an electrolyte solution is introduced to the dye-sensitized semiconductor material 56. As previously described, the dye-sensitized semiconductor material 56 comprises a porous semiconductor material such as titanium oxide ($TiO_2$), for example. The electrolyte solution fills the porous areas separating the individual crystals of the semiconductor material 56. The electrolyte solution generally includes iodide and/or triiodide salts in an organic solvent. The iodide in the electrolyte solution provides the reductant for the cation produced by the excitation of the electron in the dye. Further, the electrolyte solution may include additives, as can be appreciated by those skilled in the art.

Finally, the structure is sealed or encapsulated by a sealing layer 68. As can be appreciated, the sealing layer 68 may include an organic material or glass, for instance. The sealing layer 68 generally protects the solar cell from external elements. While not illustrated in the present figures, it should be understood that there are electrical contacts to the TCO layer 54 and the platinum layer 64 which complete the circuit of the solar cell, as can be appreciated by those skill in the art. In one exemplary embodiment, each of the fingers 52 has a thickness T1 of approximately 1 micron and each of the fingers 66 has a thickness T2 of approximately 1 micron. The fingers 52 and the fingers 66 may be evenly spaced such that the center of each finger 52 is approximately 2.5 microns from the center of each adjacent finger 66, for example. In this embodiment, the width W1 is approximately equal to the width W2 which is approximately equal 4 microns.

As can be appreciated, the efficiency of the solar cell depends on the ratios of T1 and T2 to W1 and W2. Advantageously, the finger thicknesses (T1 and T2) may be minimized such that the area occupied by the dye-sensitized semiconductor material 56 needed for light absorption is not greatly reduced. Similarly, the spaces between the fingers 52 and 66 (W1 and W2) which are filled with the dye-sensitized semiconductor material 56 is advantageously large enough to allow for sufficient light absorption, without sacrificing the advantages that the fingers 52 and 66 represent, as described herein. Thus, the fingers 52 and 66 may have thicknesses T1 and T2 that are generally one micron or smaller (e.g., nanometers), while the spaces between the fingers 52 and 66 (W1 and W2) are at least 3 microns, but less than 20 microns.

As can be appreciated, the present embodiment of the improved solar cell having interdigitated finger electrodes functions in a manner similar to conventional solar cells but having improved performance. As previously described, once light from an incident light source is directed through the substrate 48 and the TCO layer 54, it is absorbed by the dye in the dye-sensitized semiconductor material 56. The absorption of the light produces an excited electron in the dye which is injected into the semiconductor material 56. The excited electron migrates to the TCO layer 54 and is collected in the external circuit of the solar cell. The dye molecule that injected the electron into the semiconductor material 56 then accepts an electron from the reductant in the electrolyte solution, such as iodide, thereby leaving an oxidant, such as triiodide. The platinum layer 64 provides the counter electrode for the solar cell. The oxidant diffuses through the electrolyte solution and through the porous insulative layer 62 to the platinum layer 64 where it accepts electrons from the external circuit of the solar cell, thereby producing electrical current and completing the photovoltaic effect.

One advantage of the present exemplary solar cell design incorporating interdigitated fingers 52 and 66 is the reduction in the maximum distance from any point in the semiconductor material 56 to the front electrode (i.e. the fingers 52 of the substrate 48). For example, the maximum straight line distance that an electron must migrate through the semiconductor material 56 has been reduced from 10 or more microns in a standard cell design, such as the solar cell 10 of FIG. 1, to substantially less, as in the present exemplary solar cell. For instance, if the width W1 between the fingers 52 is approximately 4 microns, the longest straight line path from any of the nano-crystals of the semiconductor material 56 to the substrate TCO layer 54 is less than 1.5 microns. As previously discussed, reducing the electron travel path in the solar cell reduces the likelihood of electron losses due to recombination, thereby resulting in a more efficient solar cell.

Another advantage of the present exemplary solar cell design incorporating interdigitated fingers 52 and 66 is the reduction in the maximum distance from any point in the electrolyte solution to the catalyzing platinum layer 64. Because the solar cell comprises platinum fingers 66 extending through the semiconductor material 56, the distance the oxidant has to travel to catalyze the electron transfer to the oxidant is reduced. For example, the maximum straight line distance that the oxidant must diffuse has been reduced from 10 microns in a standard cell design, such as the solar cell 10 of FIG. 1, to less than 1.5 microns, as in the present exemplary solar cell, since the oxidant can travel to a nearby platinum finger 66 to catalyze the electron transfer to the oxidant. As previously discussed, by reducing the travel distance of the oxidant, the internal resistance of the cell is reduced and the efficiency of the solar cell is increased. Advantageously, the present exemplary embodiment permits higher solar cell efficiencies under conditions where current may be limited by ionic diffusion, such as under conditions of high light intensity, high viscosity solvent, or thicker solar cells, for example.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A solar cell comprising:
   a first electrode having a first planar surface and comprising a first plurality of fingers extending from the first planar surface of the first electrode, wherein side walls of the first plurality of fingers are substantially perpendicular to the first planar surface;
   a second electrode having a second planar surface and comprising a second plurality of fingers extending from the second planar surface of the second electrode and in a direction toward the first planar surface of the first electrode without contacting the first planar surface, wherein side walls of the second plurality of fingers are substantially perpendicular to the second planar surface, the first and second plurality of fingers disposed alternatingly between one another and overlapping one another substantially in a single plane; and
   a dye-sensitized semiconductor material provided between the first electrode and the second electrode, wherein the dye-sensitized semiconductor material is provided about the first and second plurality of fingers.

2. The solar cell, as set forth in claim 1, wherein the first electrode comprises platinum.

3. The solar cell, as set forth in claim 1, wherein the second electrode comprises glass.

4. The solar cell, as set forth in claim 1, wherein the second electrode comprises a transparent conductive oxide (TCO).

5. The solar cell, as set forth in claim 1, wherein each of the first and second plurality of fingers has a thickness of less than or equal to approximately 1 micron.

6. The solar cell, as set forth in claim 1, wherein each of the first plurality of fingers is spaced at a width in the range of approximately 3–20 microns from any of the directly adjacent of the first plurality of fingers.

7. The solar cell, as set forth in claim 1, wherein each of the first plurality of fingers has a thickness that is less than or equal to the width from each respective finger to the next adjacent one of the first plurality of fingers.

8. The solar cell, as set forth in claim 1, wherein the first plurality of fingers comprises a first set of fingers having a first height and a second set of fingers having a second height, wherein the second height is greater than the first.

9. The solar cell, as set forth in claim 8, wherein each of the second set of fingers is coupled to the first electrode adjacent each of the first set of fingers.

10. The solar cell, as set forth in claim 1, wherein the dye-sensitized semiconductor material comprises a porous nano-crystalline material.

11. The solar cell, as set forth in claim 1, wherein the dye-sensitized semiconductor material comprises titanium oxide ($TiO_2$).

12. The solar cell, as set forth in claim 1, wherein the dye-sensitized semiconductor material comprises an electrolyte solution.

13. The solar cell, as set forth in claim 12, wherein the electrolyte solution comprises iodide.

14. A solar cell comprising:
   a first electrode having a first planar surface and comprising a first plurality of fingers extending from the first planar surface, wherein side walls of the first plurality of fingers are substantially perpendicular to the first planar surface;
   a second electrode having a second planar surface and comprising a second plurality of fingers extending from the second planar surface, wherein side walls of the second plurality of fingers are substantially perpendicular to the second planar surface, wherein each of the second plurality of fingers are interdigitated with the first plurality of fingers; and
   a dye-sensitized semiconductor material provided between the first electrode and the second electrode, wherein the dye-sensitized semiconductor material is provided about each of the first plurality of fingers and the second plurality of fingers.

15. The solar cell, as set forth in claim 14, wherein the first electrode comprises platinum.

16. The solar cell, as set forth in claim 14, wherein the second electrode comprises a transparent conductive oxide (TCO).

17. The solar cell, as set forth in claim 14, wherein each of the first plurality of fingers has a thickness of less than or equal to approximately 1 micron.

18. The solar cell, as set forth in claim 14, wherein each of the first plurality of fingers is spaced at a width in the range of approximately 3–20 microns from any of the directly adjacent of the first plurality of fingers.

19. The solar cell, as set forth in claim 14, wherein each of the first plurality of fingers has a thickness that is less than or equal to the width from each respective finger to the next adjacent one of the first plurality of fingers.

20. The solar cell, as set forth in claim 14, wherein each of the second plurality of fingers has a thickness of less than or equal to approximately 1 micron.

21. The solar cell, as set forth in claim 14, wherein each of the second plurality of fingers is spaced at a width in the range of approximately 3–20 microns from any of the directly adjacent of the second plurality of fingers.

22. The solar cell, as set forth in claim 14, wherein each of the second plurality of fingers has a thickness that is less than or equal to the width from each respective finger to the next adjacent one of the second plurality of fingers.

23. The solar cell, as set forth in claim 14, wherein each of the first plurality of fingers is spaced at a width in the range of approximately 3–20 microns from any of the directly adjacent of the second plurality of fingers.

24. The solar cell, as set forth in claim 14, comprising an insulative layer disposed between the first electrode and the dye-sensitized semiconductor material.

25. The solar cell, as set forth in claim 14, wherein the dye-sensitized semiconductor material comprises a porous nano-crystalline material.

26. The solar cell, as set forth in claim 14, wherein the dye-sensitized semiconductor material comprises titanium oxide ($TiO_2$).

27. The solar cell, as set forth in claim 14, wherein the dye-sensitized semiconductor material comprises an electrolyte solution.

28. The solar cell, as set forth in claim 27, wherein the electrolyte solution comprises iodide.

\* \* \* \* \*